United States Patent
Genoni et al.

(10) Patent No.: US 9,449,126 B1
(45) Date of Patent: Sep. 20, 2016

(54) SYSTEM AND METHOD FOR DISPLAYING CONTENT ACCORDING TO A TARGET FORMAT FOR PRESENTATION ON A TARGET PRESENTATION DEVICE

(75) Inventors: Thomas Charles Genoni, San Francisco, CA (US); Peter S. Cho, San Francisco, CA (US); Norris Hung, San Francisco, CA (US); Eric Todd Lovett, Palo Alto, CA (US); Huan Zhao, San Francisco, CA (US)

(73) Assignee: Inkling Systems, Inc., San Francisco, CA (US)

( * ) Notice: Subject to any disclaimer, the term of this patent is extended or adjusted under 35 U.S.C. 154(b) by 319 days.

(21) Appl. No.: 13/487,041

(22) Filed: Jun. 1, 2012

(51) Int. Cl.
*G06F 9/455* (2006.01)
*G06F 17/50* (2006.01)
*H04L 29/08* (2006.01)

(52) U.S. Cl.
CPC ........... *G06F 17/5027* (2013.01); *G06F 9/455* (2013.01); *H04L 67/08* (2013.01); *H04L 67/2861* (2013.01)

(58) Field of Classification Search
CPC ............. G06F 17/2247; G06F 17/211; G06F 17/218; G06F 17/3089; G06F 9/455; G06F 17/5027; H04L 67/2861; H04L 67/08
USPC ................ 715/234, 235, 236, 238, 239, 252
See application file for complete search history.

(56) References Cited

U.S. PATENT DOCUMENTS

| | | | |
|---|---|---|---|
| 6,211,876 B1* | 4/2001 | Ackermann ...... | G06F 17/30675 704/239 |
| 6,892,348 B1* | 5/2005 | Truelove et al. ............. | 715/255 |
| 7,689,908 B2* | 3/2010 | Yan ........................... | G06F 8/38 715/238 |
| 7,761,591 B2* | 7/2010 | Graham ................. | G06Q 40/02 709/204 |
| 9,142,192 B2* | 9/2015 | Hou ......................... | G09G 5/14 |
| 2001/0041973 A1* | 11/2001 | Abkowitz et al. .............. | 703/23 |
| 2002/0011990 A1* | 1/2002 | Anwar ................... | G06F 3/1203 345/173 |
| 2003/0177441 A1* | 9/2003 | Clarke ................... | G06F 17/218 715/229 |
| 2007/0022442 A1* | 1/2007 | Gil et al. ......................... | 725/62 |
| 2010/0131293 A1* | 5/2010 | Linthicum ............. | G06Q 50/24 705/3 |
| 2010/0131482 A1* | 5/2010 | Linthicum .......... | G06F 19/3406 707/706 |
| 2011/0007091 A1* | 1/2011 | Homma ................. | G06F 3/1431 345/619 |
| 2011/0117999 A1* | 5/2011 | Anderson ............... | G07F 17/32 463/20 |
| 2011/0295830 A1* | 12/2011 | Swahn .......................... | 707/706 |
| 2013/0024290 A1* | 1/2013 | Berg et al. ................. | 705/14.66 |

(Continued)

OTHER PUBLICATIONS

Pouncey, I. and York, R.; "Beginning CSS: Cascading Style Sheets for Web Design"; 2011; Wiley; 3rd ed., 4 pages.

(Continued)

*Primary Examiner* — Scott Baderman
*Assistant Examiner* — Hassan Mrabi
(74) *Attorney, Agent, or Firm* — Ascenda Law Group, PC (57) ABSTRACT

A user interface for presenting a set of related pages of an electronic content work for view at the same time. The pages are sized according to a target format for presentation of the electronic content work, and may also be formatted according to user-defined font and zoom criteria. Each of the related pages comprises a media object, for example a markup language object. Responsive to user manipulation of presentation criterion for the set of related pages, the set of related pages is reformatted and so presented in near real-time. In some instances, a user may manipulate controls of the user interface to isolate a content object included within the set of related pages, have information regarding that content object presented and even edit the content object in-line with the present view.

8 Claims, 11 Drawing Sheets

(56) References Cited

U.S. PATENT DOCUMENTS

| | | | |
|---|---|---|---|
| 2013/0179761 A1* | 7/2013 | Cho | G06F 17/21 715/202 |
| 2014/0075344 A1 | 3/2014 | Bentrup | |
| 2014/0173393 A1 | 6/2014 | Roy et al. | |
| 2015/0248484 A1* | 9/2015 | Yu | G06F 17/30867 707/711 |

OTHER PUBLICATIONS

Final Office Action dated Oct. 23, 2015, for US. Appl. No. 13/759,309, filed Feb. 5, 2013, 13 pages.

Amendment and Response to Office Action filed Jun. 26, 2015, for U.S. Appl. No. 13/759,309, filed Feb. 5, 2013, 9 pages.

Office Action dated Mar. 27, 2015, for U.S. Appl. No. 13/759,309, filed Feb. 5, 2013, 12 pages.

* cited by examiner

SYSTEM AND METHOD FOR DISPLAYING CONTENT ACCORDING TO A TARGET FORMAT FOR PRESENTATION ON A TARGET PRESENTATION DEVICE

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in the drawings that form a part of this document: Copyright Inkling Systems, Inc., All Rights Reserved.

FIELD OF THE INVENTION

The present invention is directed to systems and methods for displaying content, and in particular such displays as provide a single view of a group of related pages from a single work so as to permit an editor or other user a convenient way to assess the layout of the content across the displayed pages.

BACKGROUND

Development of traditional print media and other rich content (e.g., textbooks, travel books, magazines, cookbooks, how-to books, literature, and the like) involves many tasks, including managing edits and the overall publication process. Historically, these tasks have required the use of hard copy proofs (e.g., galleys) that editors and others review and mark up. As print media have transitioned to electronic media, the editing process has remained relatively unchanged in terms of the tools used by editors to review and revise the content. As such, publishers and others associated with new electronic media have not taken advantage of the flexibility that computer-based tools can bring to the publishing process.

SUMMARY OF THE INVENTION

In various embodiments, the present invention provides systems and methods for displaying, responsive to user-designation of a set of related pages for view, the set of related pages of an electronic content work within a single view on a display of a computer system. The view, facilitated by a user interface configured in accordance with aspects of the invention, presents the pages of the electronic content work sized according to a target format for presentation of the electronic content work. In some embodiments, the presentation may conform to user-defined font and zoom criteria.

In one embodiment of the invention, each of the related pages comprises a markup language object, however, other page formats may also be used. For example, pages formatted in any of MICROSOFT Corp.'s WORD® document format (.DOC, .DOCX), Adobe, Inc.'s Portable Document Format (.PDF) or InDesign™ formats, ePub format, graphics interchange (GIF) format, portable network graphics (PNG) format, joint photographic experts group (JPEG) format, exchangeable image file format (EXIF), tagged image file format (TIFF), raw format, bitmap (bmp) format, scalable vector graphics (SVG) format, or postscript (PS) format may be used in various embodiments of the invention. Responsive to user manipulation of at least one presentation criterion for the set of related pages, the set of related pages may be reformatted for presentation according to a new one or more user-defined presentation criteria and so presented on the display of the computer system. The new user-defined presentation criteria may include any or all of a target presentation device for the electronic content work, a zoom criterion or a font size criterion. In some instances, a user may manipulate controls of the user interface to isolate a content object included within the set of related pages, have information regarding that content object presented and even edit the content object in-line with the present view.

These and further embodiments of the invention are described in greater detail below.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments of the invention discussed in the present document.

DETAILED DESCRIPTION

Disclosed herein are systems and methods for displaying content, and in particular such displays as provide a single view of a group of related pages from a single work so as to permit an editor or other user a convenient way to assess the layout of the content across the displayed pages. By "pages" we mean media objects that may be formatted according to a variety of computer-readable formats described more fully below, and which include human perceptible (e.g., readable or recognizable) content, such as text and/or images (either still or moving). In some instances, pages may include audio content in addition to or in lieu of text and/or image content. Pages may also be referred to as "cards".

In U.S. patent application Ser. No. 13/353,180, filed 18 Jan. 2012, which application is assigned to the assignee of the present invention and incorporated herein by reference, systems and methods for publishing electronic content are described. Included in the system are WYSIWYG (What You See Is What You Get) editors, which are editing interfaces in which the content displayed on the screen during editing appears in a form closely corresponding to its appearance on the target format. While these interfaces are useful for editing fine details, sometimes an editor needs to view the content in a different form. For example, when an editor wishes to determine whether the content conforms to layout guidelines specified for the work under consideration, the editor needs to view several related pages (e.g., those which make up an entire chapter) at a time. Further, when an editor needs to determine whether the content layout will work for different target formats on which the content may be viewed (e.g., smart phones, tablet computers, desktop computers, etc.), the editor needs to be able to rapidly switch between views which present the same content formatted for those different devices. The present invention facilitates such views and more.

In one embodiment then, the present invention provides a user interface for a computer-based publishing tool (or publishing environment) that facilitates a view of a group of related pages (such as a section, chapter, or other defined grouping) of an electronic content work (such as an electronic book, magazine, or other work or portion thereof). Pages may be deemed related by any of a number of criteria, including but not limited to content, subject, topic, hierarchical organization of an electronic content work, layout, or other criteria. For example, pages may be related because they share a common cascading style sheet (CSS) class or other criteria. In some instances, the criterion (or criteria) for relating pages may be specified by a user, but this is not a requirement.

Associated with the user interface element is a rendering engine that manipulates the content produced by the publishing tool for display according to user-selected target formats. The target formats may include the kind of a view the user desires (e.g., specified in terms of the target platform the content will be viewed upon), the font size for a particular view (e.g., as selected from a menu of predetermined font options), and/or a magnification level at which the content should be viewed (e.g., ranging in predetermined increments, or, perhaps a sliding scale, from a fraction of true size, to true size for the target format, and potentially a larger than true size for same).

Figure 1:
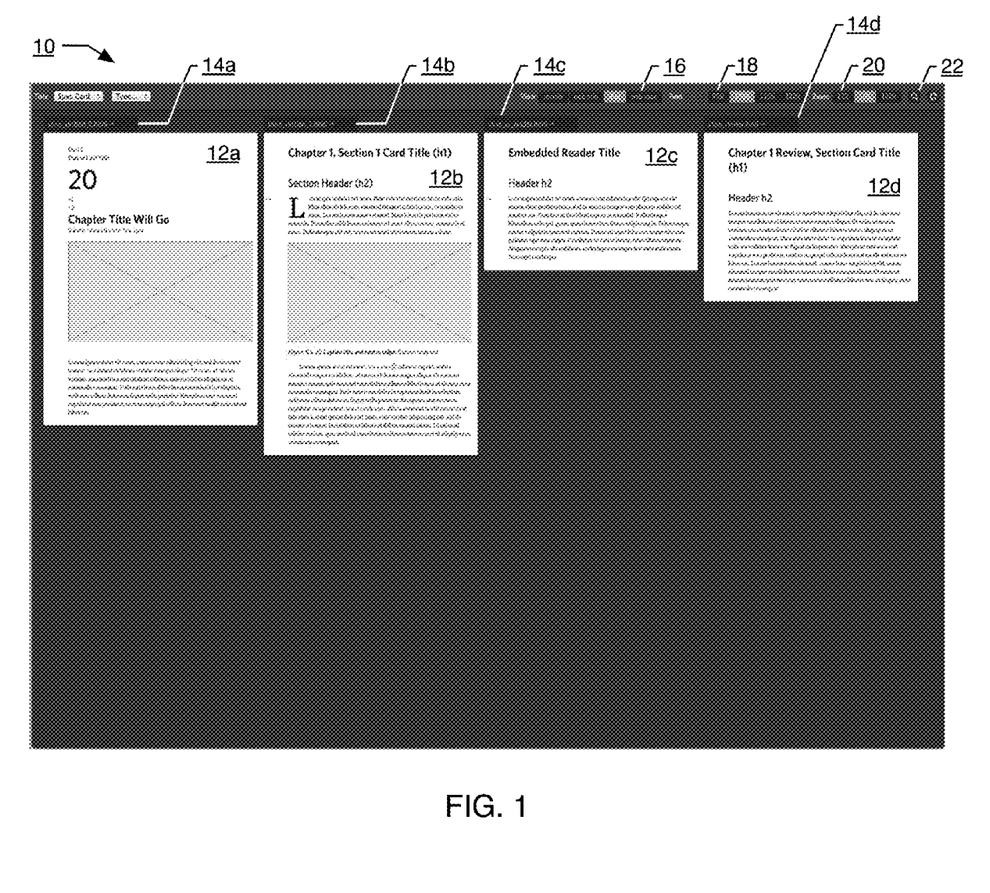
FIGS. 1-6 illustrates aspects of a user interface for a content publishing tool configured in accordance with embodiments of the present invention.

FIG. 1 illustrates one example of a user interface (UI) 10 (e.g., as viewed in a web browser on a client computer system) provided by a publishing tool in accordance with an embodiment of the present invention. In this example, related pages 12a-12d, which comprise a chapter, of an electronic work are presented for review. The pages may be markup language (ML) documents and in one embodiment are S9ML documents. S9ML is a platform-agnostic, extensible markup language (XML) and hypertext markup language (HTML)—based specification that semantically describes the content in an electronic work. The electronic work may thus be a graph of content objects (described in S9ML) and the user interface 10 presents the requested content objects 14a-14d (in this case the related pages that comprise the chapter) for display according to user-defined criteria. In other instances the pages may be formatted differently, for example as MICROSOFT Corp. WORD® documents (.DOC, .DOCX), Adobe, Inc Portable Document Format (.PDF) or InDesign™ documents, ePub documents, graphics interchange (GIF) format documents, portable network graphics (PNG) documents, joint photographic experts group (JPEG) images, exchangeable image file format (EXIF) images, tagged image file format (TIFF) images, raw format images, bitmap (bmp) images, scalable vector graphics (SVG), or postscript (PS) documents.

Figure 2:
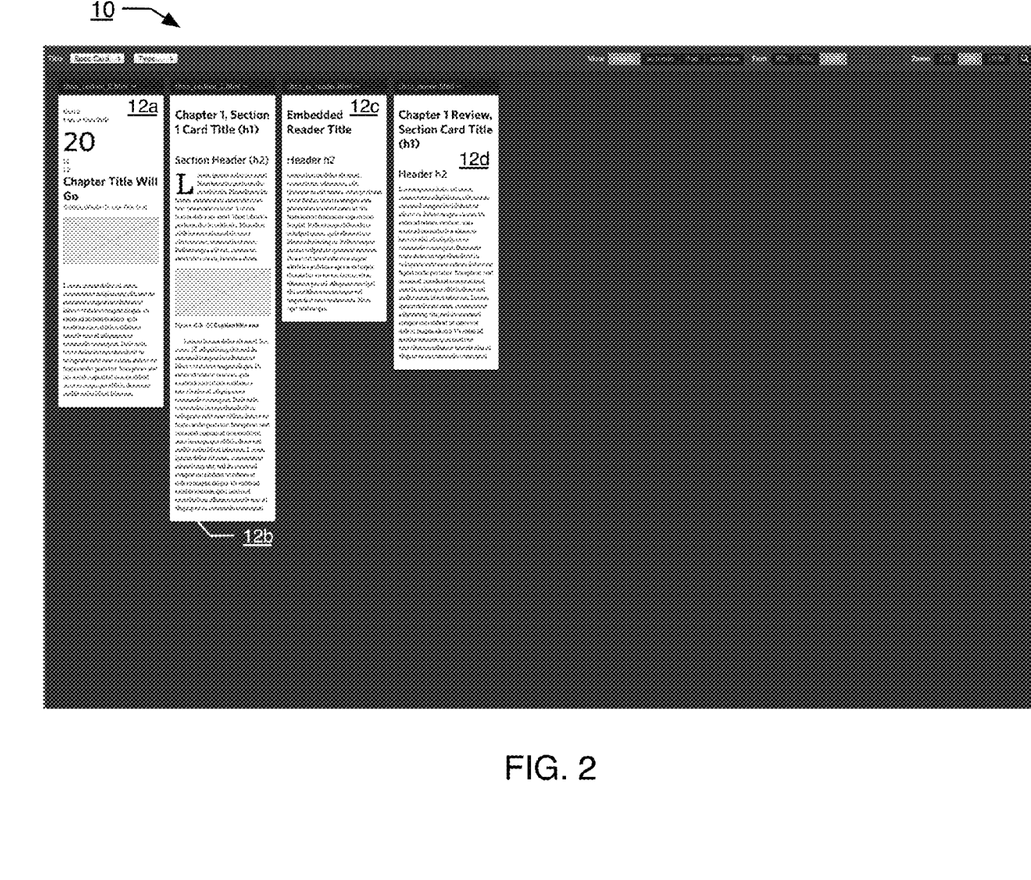
Figure 3:
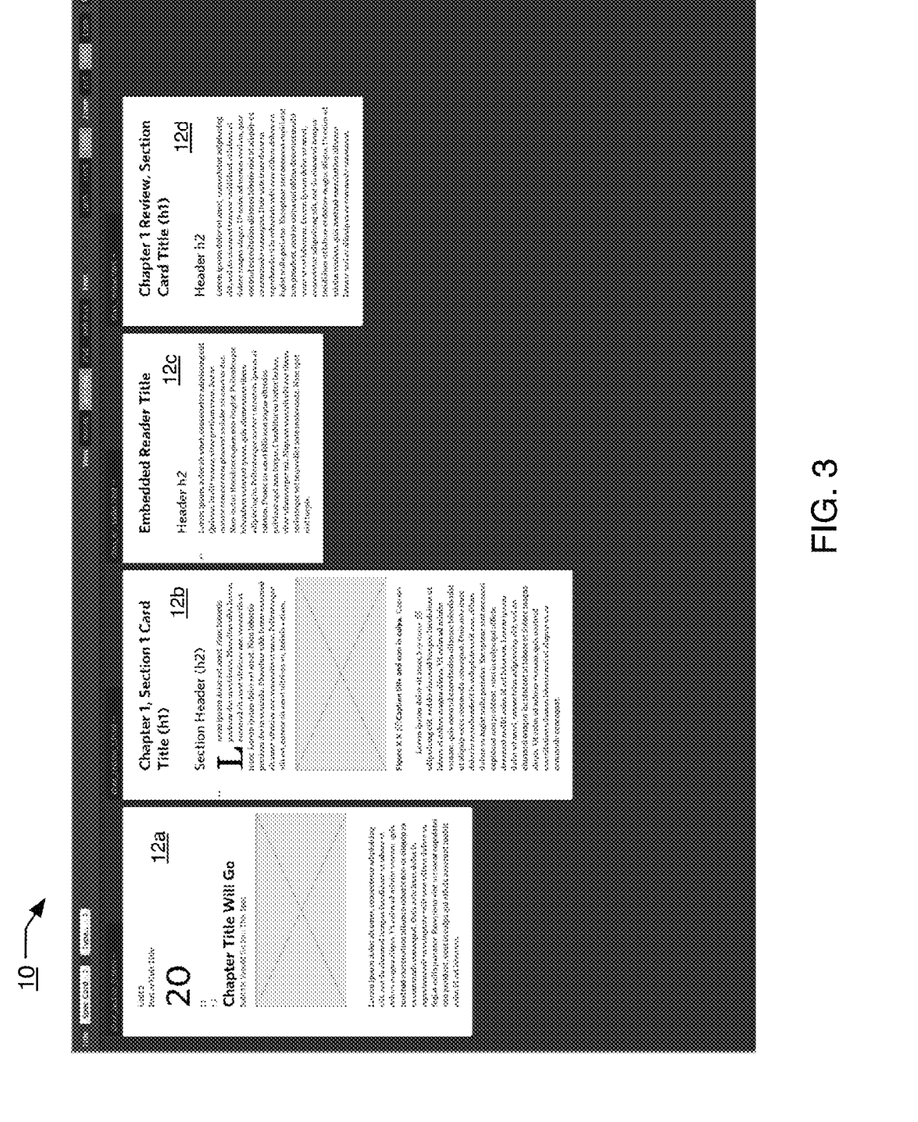

The user-defined criteria include a view criterion, selectable via a view selection control 16. The view criterion specifies the target format in which the pages should be rendered. Examples of target formats include those suitable for tablet computer systems (e.g., Apple, Inc.'s iPad™), smart phones (e.g., Apple, Inc.'s iPhone™, or mobile phones running Google, Inc.'s Android™ operating system), or web browsers (e.g., Apple, Inc.'s Safari™, Google, Inc.'s Chrome™, or Microsoft Corp.'s Internet Explorer™) running on personal computer systems (e.g., laptop computers, desktop computer systems, netbooks, etc.). In some cases, the target format may be that of a specified printing device or a preview of how the pages would look when formatted for a specified printing device. Because the content is represented in ML-based documents, it can be resized and reflowed as necessary, in near real time, to accommodate the selected target display. For example, FIG. 1 illustrates pages (or cards) 12a-12d formatted for display on a tablet computer system. FIG. 2, however, presents the same content (i.e., the same pages 12a-12d) formatted for display on a mobile device such as a smart phone. Notice that each page includes the same text and images but that the formatting has changed. This dynamic resizing and reflowing of content, which in one embodiment may be accomodated by including CSS3 media queries in stylesheets defining the pages, is required in order to accommodate the different display available on a mobile device (e.g., which is typically shorter and narrower than the display of a tablet computer system). FIG. 3 presents the same content (pages 12a-12d) in yet a further view—this one suitable for display via a web browser running on a personal computer system.

Figure 11:
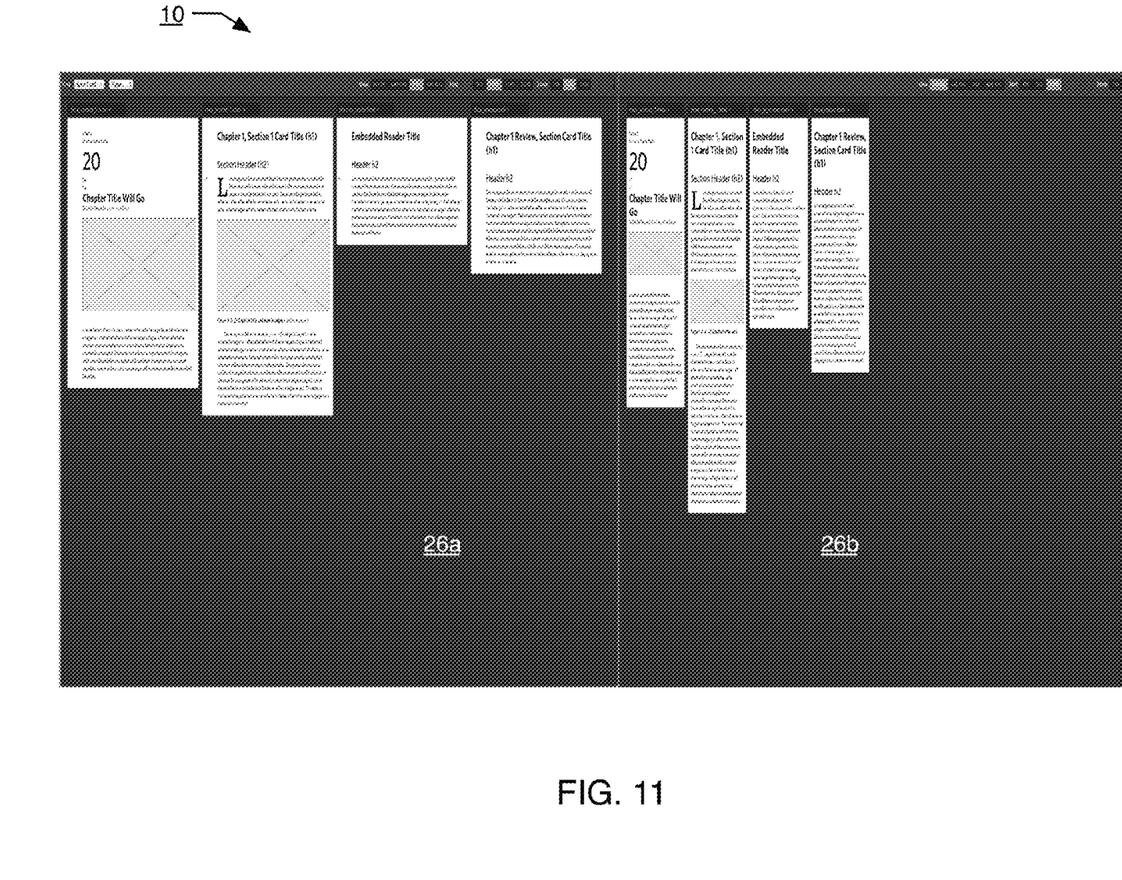
FIG. 11 illustrates an example of a multiple view feature of a user interface configured in accordance with an embodiment of the present invention, which affords a user the ability to examine content arranged for presentation on various target formats/platforms within a single screen.

In some instances it may be beneficial for the editor to view the same content as it would appear on different devices within a single, side-by-side, arrangement. Illustrated in FIG. 11 is such a presentation. On the left, in a section 26a of the UI 10, the set of related pages under consideration is displayed according to a tablet computer view. On the right, in a section 26b of UI 10, the same set of related pages is displayed according to a smart phone view. In other embodiments, views for two, three or more target formats/platforms may be presented displayed side-by-side or in quadrants or other sections of UI 10 so as to permit the editor a comprehensive look at how the same content would be formatted across different devices.

Figure 10:
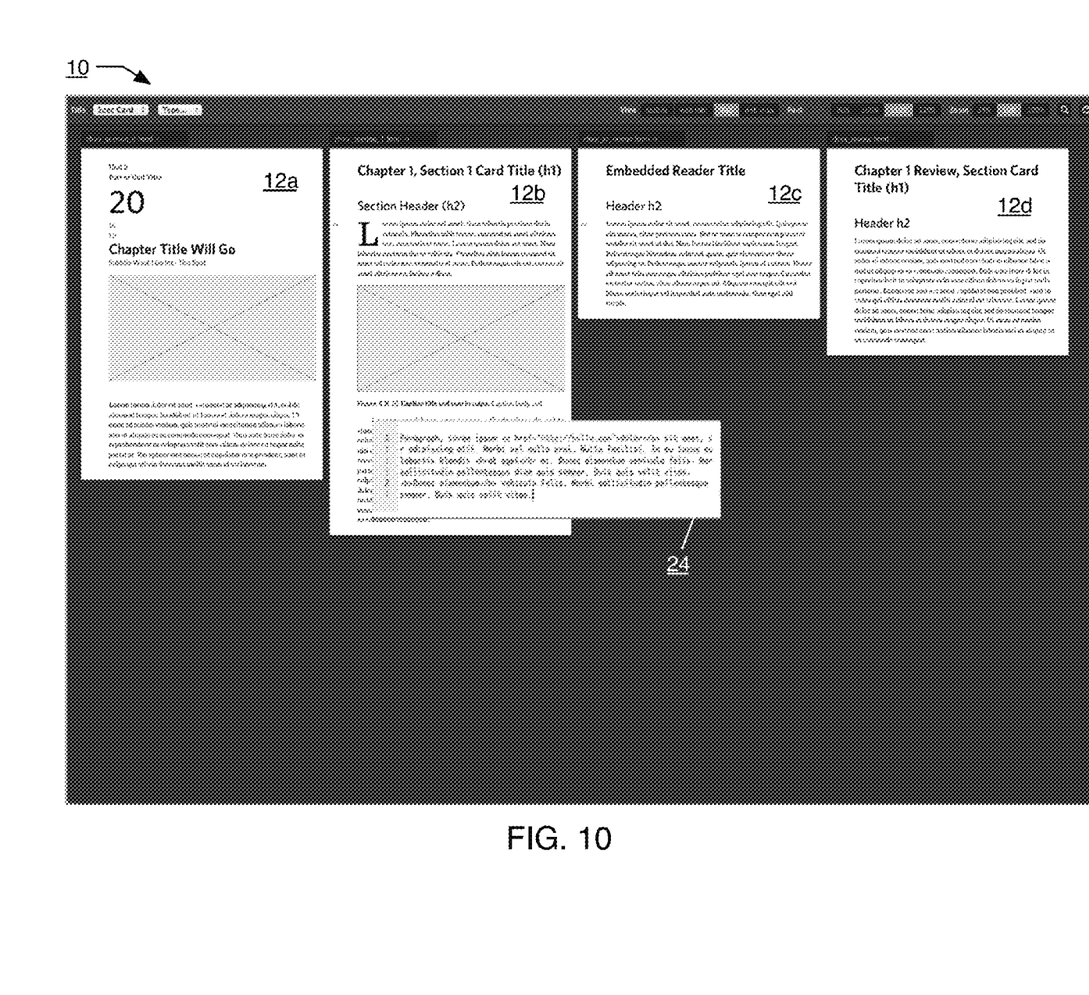
FIG. 10 illustrates an example of an in-line editing feature, which may be present in embodiments of a user interface configured in accordance with the present invention.

By providing the editor with the ability to view the same content as would be displayed in different target formats, the present invention allows the editor to make decisions regarding content layout rapidly. For example, if text or images are not being rendered as desired in one set of display parameters or the other, the editor can immediately determine the same and initiate corrections. Indeed, some embodiments of the present invention allow in-line editing of text, images, or other objects directly from the user interface 10. FIG. 10 illustrates an example of this in-line editing feature. When invoked, an edit window 24 opens with user interface 10, allowing direct editing of the ML or other content of the page. This in-line editing of one or more of the pages may also be provided in the multiple target format view illustrated in FIG. 11. In other instances, the editing requires use of different tools of the publishing system.

Returning now to FIG. 1, another of the user-defined criteria is a font criterion, selectable via a font selection control 18. In this example, the view selection control, font selection control and a zoom selection control 20 are configured as option buttons (although here a button refers to an action rather than a shape). Option buttons are graphical user interface elements that allow for user selection by way of a cursor selection action, such as a "click". Here, predefined selection options within each option category (view, font and zoom) are presented for the user and the user is able to select desired options of each category by positioning a cursor over the button representing the desired option and clicking the cursor. The user interface may be configured so that upon launch of the multi-page viewing tool of which it is a part presents the selected content in a predetermined manner according to a default arrangement of each control option. For example, upon launch, the tool may be configured to present the content in the tablet device view, at 100% font size and 50% zoom (as shown in FIG. 1). From there, the user may be permitted to make selection settings within each of the user-selectable option categories to view the content in the associated arrangement. Of course, in other instantiations, the user election options may be provided by way of list boxes, check boxes, data grids, combo boxes, drop down lists, or other user interface elements.

Figure 4:
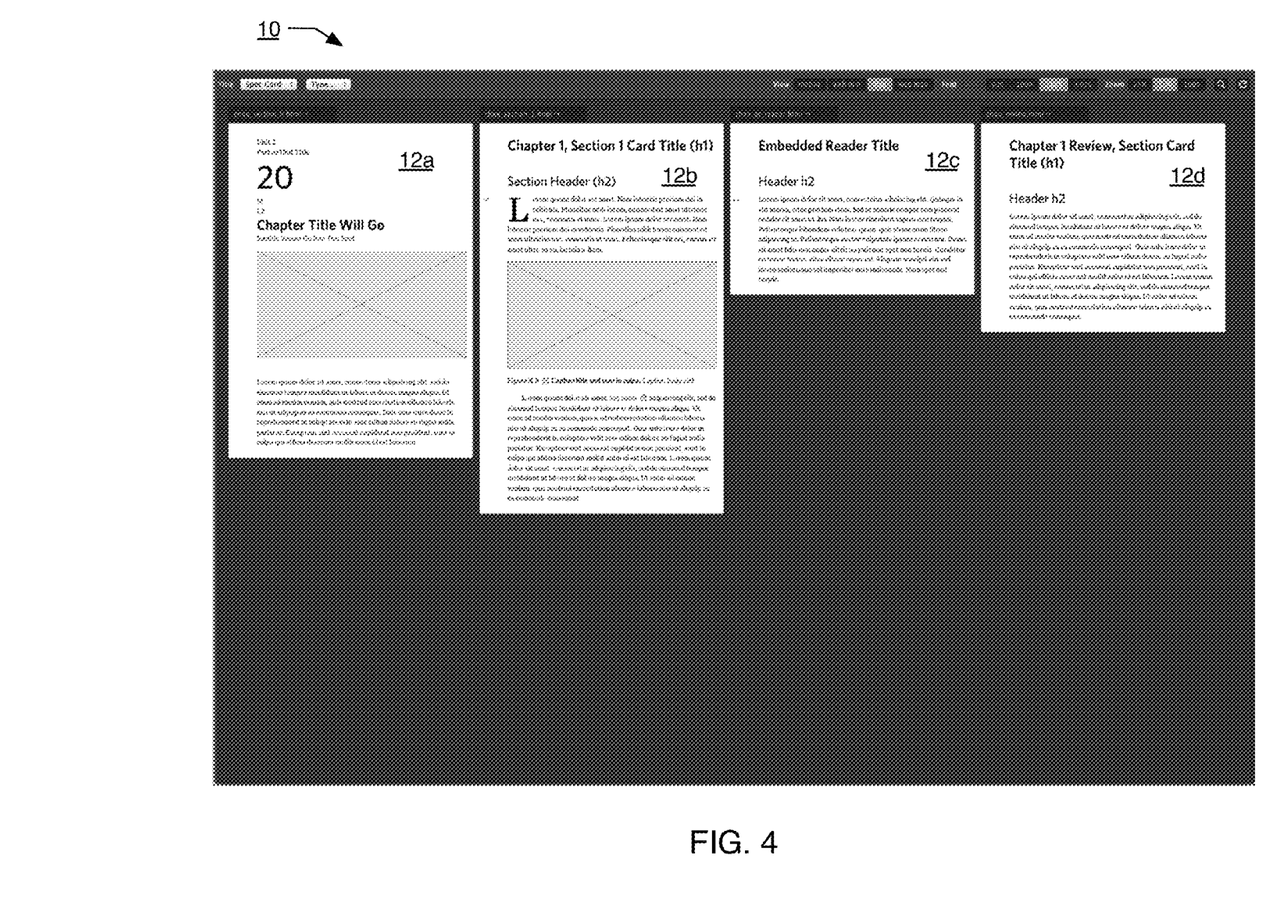

The font selection criterion allows an editor to view content within a target format at different font sizes. For example, FIG. 1 shows the content arranged for presentation on a tablet computer at 100% font size. FIG. 4 shows the same content (at the same zoom setting as in FIG. 1) arranged for presentation on the tablet computer system, but at 110% font size. Here, 100%, 110% and other front sizes are with reference to a specified base font size for the target format. Base font sizes for different target formats may be the same or different from one another. For example, the base font size for a tablet computer may be larger than that for a smart phone (because of the increased available screen real estate for display of the content), but within user interface 10, each may be referred to as 100% for the respective target format. Alternatively, in some cases the base font size represented by 100% may be the same across all target formats.

Because the content can be resized and reflowed on demand, viewing the text in different font sizes can be done in near real time. This affords the editor the opportunity to consider the layout of the content for one or more target formats under conditions of different font sizes. This can assist the editor with decisions concerning layouts and the like. In other instantiations, different font types (as well as sizes) may be selectable.

Figure 5:
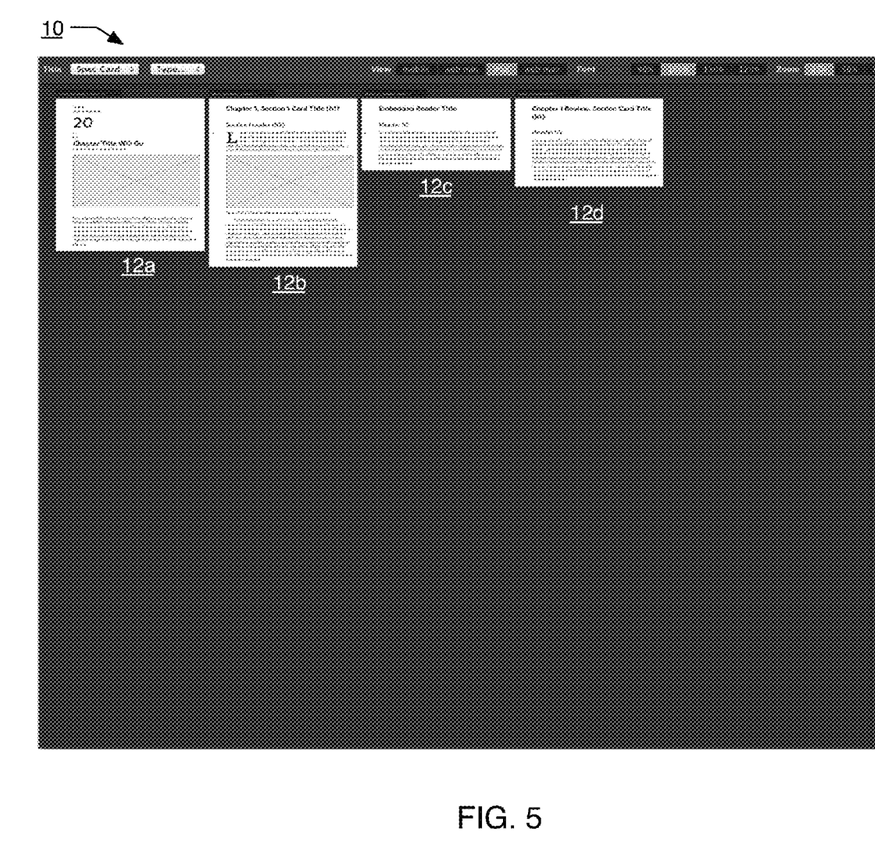
Figure 6:
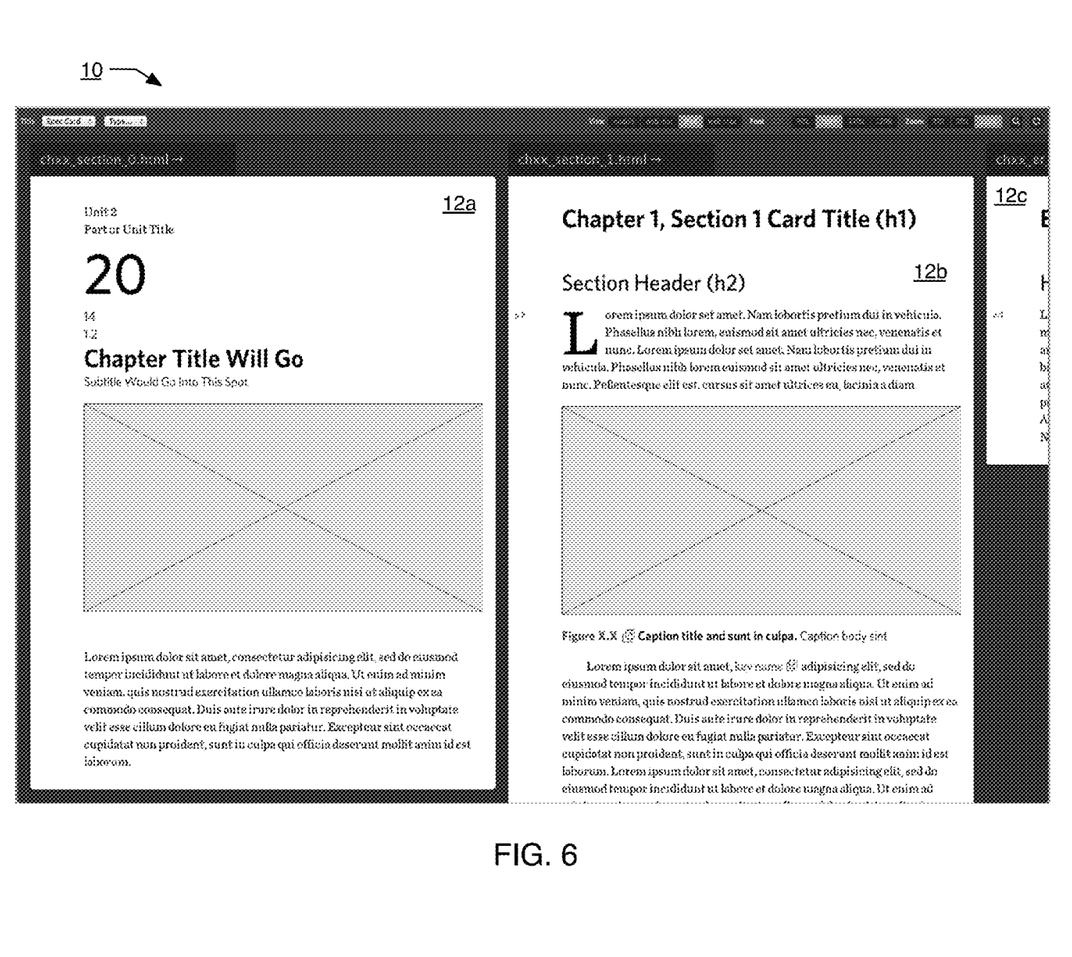

The content can also be viewed across different zoom selections by way of the zoom selection control 18. FIG. 1 shows the content arranged for presentation on a tablet computer at 50% zoom. FIG. 5 shows the same content arranged for presentation in the same target format but at 25% zoom and FIG. 6 shows the same content arranged for presentation in the same target format but at 100% zoom. In each instance the content is shown at the same font setting. The zoom selection allows for an editor to change the scale of the viewed area in order to examine details of the content presented via user interface 10. In cases where side-by-side groupings of pages are presented (e.g., as shown in FIG. 11), each grouping of pages may be independently formatted in accordance with user-desired font and zoom characteristics.

Returning to FIG. 1, one further user interface element is shown. Isolation element 22 (here illustrated in the shape of a magnifying glass) allows an editor to highlight a particular content element on one of the pages. Although not shown in the illustration, such isolation (activated by selection of the isolation tool and then clicking on the content object of interest) will result in a description of the content element being provided to the user. This can assist users that, while familiar with content editing, may be unfamiliar with the software-like representation in which the content may be displayed. Further, such isolation may allow a user to view all similar content elements across the collection of related pages, or even across the entire electronic work. Content elements may include items such as images, headings (of any level), paragraphs, titles, etc. Because the content is semantically indexed, such searches across pages, chapters, sections, etc. are possible.

Isolation may also be a first step in an in-line editing process. For example, if the editor decides that the format of a second level heading needs to be changed, the editor can isolate to display such elements across the pages of a chapter (or even the entire work), and then perform an in-line edit, e.g., by causing the associated S9ML that defines headings of the second level to be displayed within a window in the user interface 10. Within the editing window, edits may be made directly, and when applied may cause the content within the user interface 10 to be immediately presented in accordance with the edits so that the editor can determine if the desired change has been effected correctly.

Figure 7:
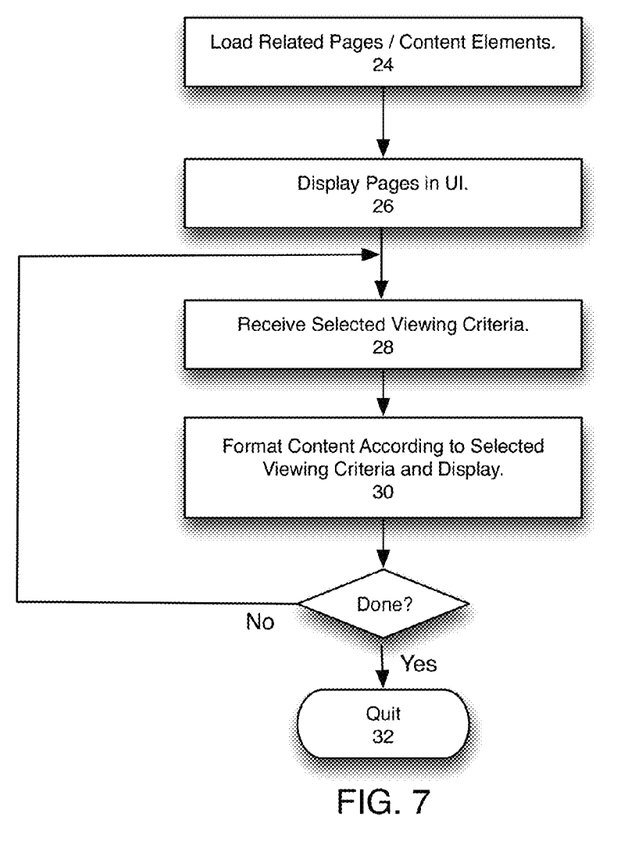
FIG. 7 is a flowchart illustrating aspects of a method of presenting electronic content, according to embodiments of the present invention.

FIG. 7 is a flow diagram that highlights steps in an example of an editing session that makes use of the present user interface tools. Beginning at 24, a collection of pages (such as a section, chapter, etc.) is loaded into the computer-based publishing tool (or publishing environment). At 26, a collection of related pages (or other content segments) is selected for display and is displayed in the user interface discussed above. In some instances, the pages (or other content segments) are displayed according to default viewing options, which define a target format, zoom size and font size. In other instances, such viewing options are selected at the time the pages (or other content elements) are initially displayed.

Thereafter, responsive to user input 30 specifying one or more viewing criteria, the content is dynamically configured to be consistent with the selected viewing criteria and displayed 32 in the user interface. This process continues for the selected content until the user (e.g., an editor) quits the display of content at 32. The various viewing criteria may include specification of a target format for presenting the content, font size and/or zoom setting. In addition, viewing criteria specifying a content element for isolation may be accommodated.

In addition to the S9ML discussed above, electronic content presented for display in the present user interface may include one or more text, graphic, audio, visual, and/or audiovisual elements. In some examples, the electronic content may be portions of electronic textbooks, electronic pamphlets, electronic workbooks, electronic documents, e-books, and the like. In some examples, the electronic content may not be a complete work, but may be portions of a work. As indicated above, the electronic content work may be stored according to any number of or combination of electronic formats including markup language files, PDF files, InDesign™ files, ePub files, Cascading Style Sheets (CSS) and the like, GIF images, PNGs, JPEG images, EXIF images, TIFF images, raw format images, bmp images, SVGs, PS files, shockwave flash (SWF) files, Waveform Audio File Format (WAV) format files, Motion Picture Experts Group (MPEG) I, II, III, and/or IV files, or other forms of digital content. An electronic content work may be one or more pieces, or "portions" of electronic content, which may be organized into a coherent whole. The term electronic content may be used to refer to both a portion of an electronic content work, or the electronic content work itself.

Figure 8:
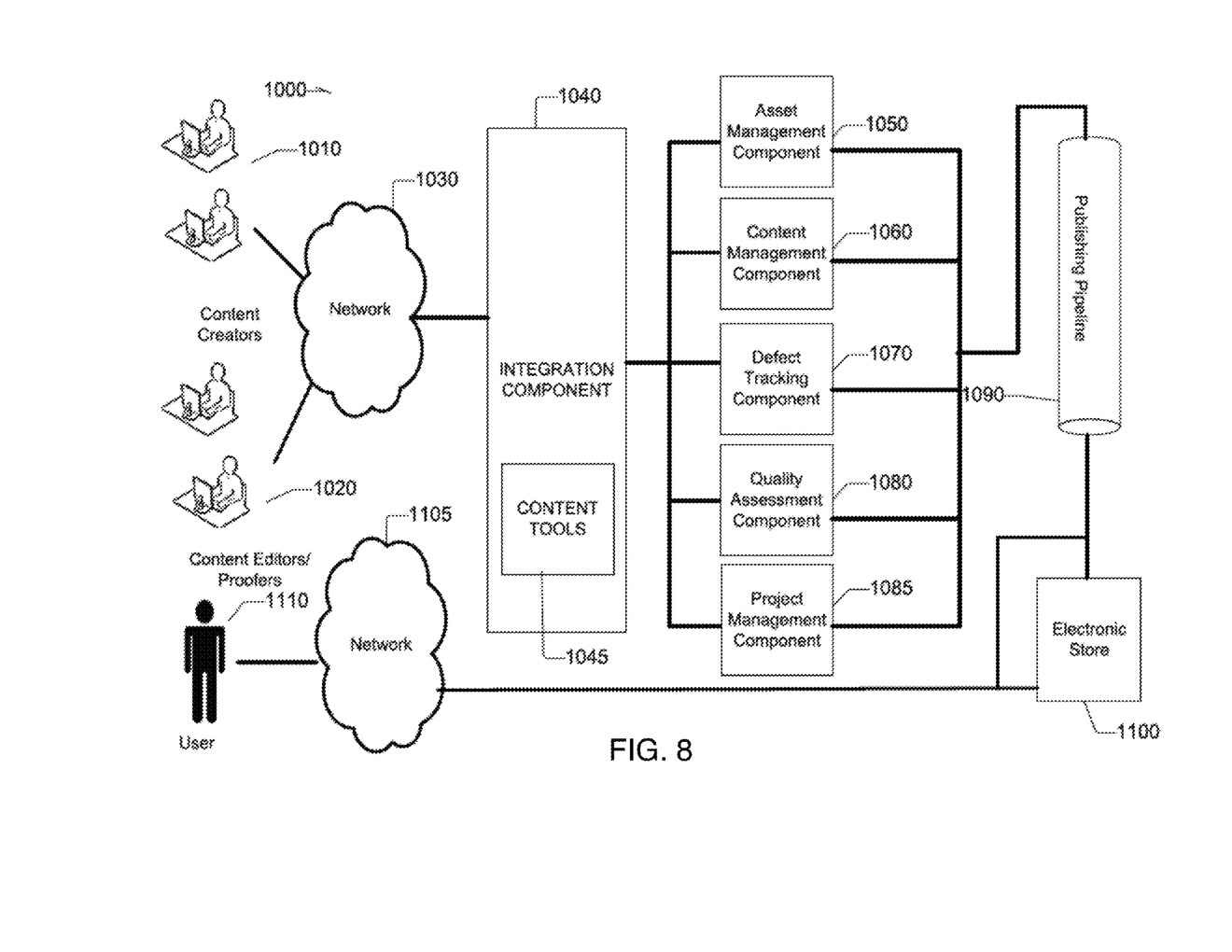
FIG. 8 illustrates an example of a publishing system, which may include user interface tools consistent with embodiments of the present invention.

FIG. 8 illustrates an example of a publishing system 1000, which may include user interface tools such as those described above. The various components of the system 1000 may be connected to each other directly or through a network. For example, one or more content creators 1010 and one or more content editors 1020 or other contributors may utilize computing devices to interface with the system 1000 through network 1030. Network 1030 may include any electronic network that allows content creators 1010 and content editors 1020 to access the components of the system 1000. For example, one or more portions of network 1030, or network 1105 (which may be the same or different network as network 1030) may be an ad hoc network, an intranet, an extranet, a virtual private network (VPN), a local area network (LAN), a wireless LAN (WLAN), a wide area network (WAN), a wireless WAN (WWAN), a metropolitan area network (MAN), a portion of the Internet, a portion of the Public Switched Telephone Network (PSTN), a cellular telephone network, another type of network, or a combination of two or more such networks, or the like. While certain components of FIG. 8 may be shown as directly connected, they may also be connected through a network, such as a network similar to networks 1030 and 1105. For example, asset management component 1050, content management component 1060, defect tracking component 1070, quality assessment component 1080, project management component 1085, publishing pipeline 1090, electronic store 1100, and integration component 1040 may be connected directly, through a network, or through a combination of direct or network connections. Furthermore, while each component is logically separated from the other components for convenient description, it should be recognized that some or all of the functionality of one component might be performed by a different component.

Integration component 1040 may be a network-addressable component, which may provide a user interface that allows contributors, including content creators 1010 and content editors 1020, to interface with the rest of the system. In some examples, the interface may be a graphical user interface (GUI) that may allow content editors 1020 or other contributors to view, edit, and manage various portions of electronic content in the manners described above, e.g., using content tools 1045. Thus, content tools 1045 may include editing interfaces in which the content displayed on the screen during editing appears in a form closely corresponding to its appearance in the target format, and according to user-specified font and zoom criteria. Integration component 1040 may also facilitate communication between other various components of the system 1000. For example, integration component 1040 may direct one or more of the other components to take some action, communicate with another component, relay information between components, or the like.

In one example, integration component 1040 may be located on one or more computer systems accessible by content creators 1010 and content editors 1020 through network 1030. In yet other examples, integration component 1040 may be locally executable on computer terminals of contributors such as content creators 1010 and editors 1020 and may utilize network 1030 to access the other components of the system 1000. In yet other examples, integration component 1040 may include components executable on both the computer terminals of content creators 1010 and editors 1020 as well as pieces accessible and executing on a remote server accessible over network 1030.

In some examples, integration component 1040 may interface with asset management component 1050 in order to facilitate the presentation of the electronic content work from a number of content portions. Content portions may be any audio, visual, audiovisual, text, or other content that is intended to be merged with other content portions into an electronic content work. Content portions may also be referred to as "assets." Asset management component 1050 may be a network-addressable component, which, in conjunction with integration component 1040, may allow for the management of the content creation process by managing the submission, modification, and integration of various component portions of the electronic content. This creation management process may include indexing and tracking submitted components, identifying missing content, assigning sections of missing content to one or more contributors, and managing the integration of submitted content into a complete or nearly complete version of the electronic content work. In some examples, the asset management component 1050 may implement version tracking to track changes made to the component content portions.

Once the contributors are satisfied with the draft of the electronic work, the work may be submitted to the content management component 1060. In some examples, defect tracking through the defect-tracking component 1070 may also begin. Integration component 1040 may then coordinate the delivery of the content from the asset management component 1050 to the content management component 1060 (if necessary), coordinate starting of the version control of the work as a whole (in some examples, versions may be managed on the content portions and the work as a whole simultaneously), and coordinate starting the defect tracking process. Editors 1020 or other contributors may then begin editing the electronic content, for example using the user interface tools described above.

Defect tracking component 1070 may be a network-addressable component, which, in conjunction with integration component 1040, may include tools, which allow users to open defects, track defects, fix defects, and close defects found in electronic content. For example, an editor may be reviewing the content through content tools 1045 and may open defects by selecting or otherwise indicating the defect in the content itself and entering information about what is defective. Content tools 1045 may then pass this information to the defect-tracking component, which may open a defect. In other examples, defects may be opened by the quality assessment (QA) component 1080 as a result of automatic content checks performed by the quality assessment component 1080. The QA component may send a message to the defect-tracking component 1070 with information on the defect, and the defect-tracking component 1070 may open the defect.

In some examples, user access control may be implemented through various permission-based rules. In one example, users (e.g., contributors) may belong to one or more groups of users and content may be organized into one or more groups. User groups may be given access to one or more content groups. Each user group may have one or more users, and each content group may have one or more content portions. In other examples, each user is individually given access to various portions of content or groups of portions of content. A user or group of users may be granted read, write, delete, or other access types to a portion of the content or a content group.

In some examples, integration component 1040 also includes a device simulator, which may provide a preview mode accessible to contributors. Since the electronic content may be targeted to multiple and disparate electronic device platforms, and since the content may not be rendered identically across disparate electronic device platforms, integration component 1040 may include a device simulator which allows the contributor to build the content locally (or allows integration component 1040 to interface with the publishing pipeline 1090 to build the content) for the particular desired target electronic device and through an emulator running in the system preview how the content will look and react to input and other stimuli. The emulator emulates the environment of the target electronic device so the contributor will have an accurate representation of how the electronic content performs on the target electronic device.

Project management component 1085 may be a network-addressable component and may integrate with integration component 1040 or other components of system 1000 to control and store data related to project management of one or more electronic works. Once the content is ready for publication, one or more of the contributors may publish the electronic content work. Publication (or "building" the content) is a process by which a format independent representation of the content is transformed into a format dependent representation of the content. For example, the content may be customized for a particular client device (e.g., an iPad) or for printing on a particular format (e.g., letter paper size, legal paper size, A4, or the like). This process may be done through the integration component 1040, and the publishing pipeline 1090 may build content. Once the electronic content has been built by the publishing pipeline 1090, the publishing pipeline may distribute the published content, for example by interfacing with the electronic store 1100, which may then make the content available for download by an end-user 1110 on an electronic device over a network 1105.

Figure 9:
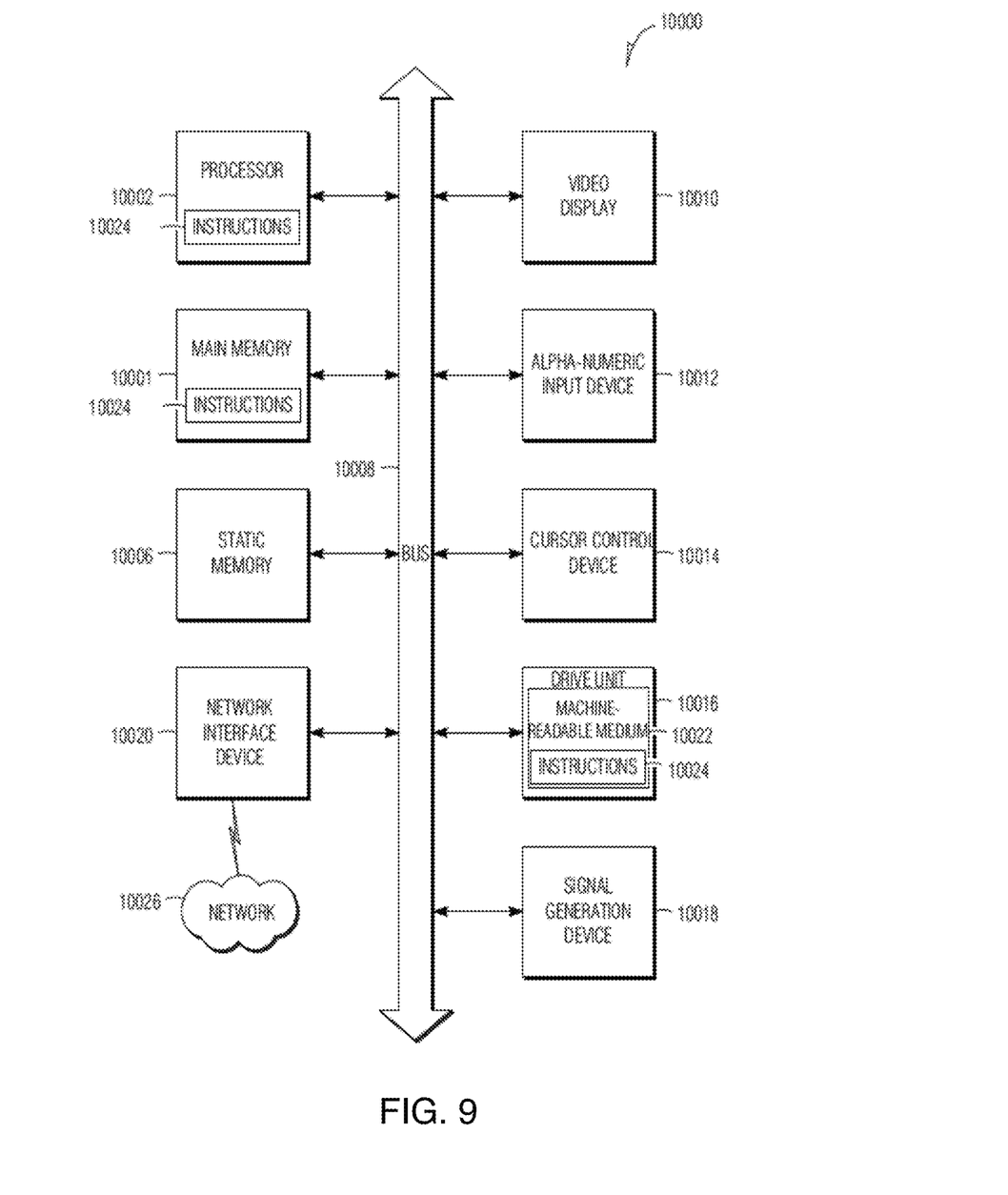
FIG. 9 shows an example of a processor-based system suitable for use in accordance with embodiments of the present invention.

The various operations of example methods described herein may be performed, at least partially, by one or more processors that are temporarily configured (e.g., by software) or permanently configured to perform the relevant operations. An example of a processor based system suitable for such configuration and operation is shown in FIG. 9. In other examples, however, the methods described herein may be at least partially performed by processors deployed across a number of machines, e.g., in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., Application Program Interfaces (APIs).)

Computer system 10000, shown in FIG. 9, within which a set of instructions for causing the machine to perform any one or more of the methods, processes, operations, or methodologies discussed herein may operate as a stand-alone device or may be connected (e.g., networked) to other machines. In a networked deployment, the machine may operate in the capacity of a server or a client machine in server-client network environment, or as a peer machine in a peer-to-peer (or distributed) network environment. Various instantiations of computer system 10000 may be servers or clients.

The example computer system 10000 includes a processor 10002 (e.g., a Central Processing Unit (CPU), a Graphics Processing Unit (GPU) or both), a main memory 10001 and a static memory 10006, which communicate with each other via a bus 10008. The computer system 10000 may further include a video display unit 10010 (e.g., a Liquid Crystal Display (LCD) or a Cathode Ray Tube (CRT)). The computer system 10000 also includes an alphanumeric input device 10012 (e.g., a keyboard), a User Interface (UI) cursor controller 10014 (e.g., a mouse), a disk drive unit 10016, a signal generation device 10018 (e.g., a speaker) and a network interface device 10020 (e.g., a transmitter).

The disk drive unit 10016 includes a machine-readable medium 10022 on which is stored one or more sets of instructions 10024 and data structures (e.g., software) embodying or used by any one or more of the methodologies or functions illustrated herein. The software may also reside, completely or at least partially, within the main memory 10001 and/or within the processor 10002 during execution thereof by the computer system 10000, the main memory 10001 and the processor 10002 also constituting machine-readable media.

The instructions 10024 may further be transmitted or received over a network 10026 via the network interface device 10020 using any one of a number of well-known transfer protocols (e.g., HTTP, Session Initiation Protocol (SIP)).

The term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform any of the one or more of the methodologies illustrated herein. The term "machine-readable medium" shall accordingly be taken to include, but not be limited to, solid-state memories, and optical and magnetic medium.

Method embodiments illustrated herein may be computer-implemented. Some embodiments may include computer-readable media encoded with a computer program (e.g., software), which includes instructions operable to cause an electronic device to perform methods of various embodiments. A software implementation (or computer-implemented method) may include microcode, assembly language code, or a higher-level language code, which further may include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, Random Access Memories (RAMs), Read Only Memories (ROMs), and the like.

Thus, systems and methods for displaying content have been described.

What is claimed is:

1. A computer-implemented method, comprising:
  displaying, responsive to user-designation of a set of related pages for view, the set of related pages of an electronic content work within a single view on a display of a computer system,
  the view presenting the pages of the electronic content work sized according to a target format for presentation of the electronic content work on a display of a first target presentation device, wherein each of the related pages comprises a media object;
  receiving a target format user input indicative of a request for presentation of the set of related pages according a different target format for presentation on a second target presentation device;
  presenting a reformatted set of related pages on the display of the computer system, the reformatted set of related pages formatted for presentation according to the different target format for presentation on the second target presentation device;

receiving an isolation user input through selection of an isolation control tool, and detecting a selection of a content element in a respective page in the single view, wherein the content element is a heading;

presenting, within the single view, highlighting of content elements that are similar to the selected content element within the set of related pages;

receiving editing user input via an editing window, wherein the editing user input includes additions or subtractions from the content or changes to the format of the content; and presenting, within the single view, the set of related pages with the editing user input incorporated.

2. The method of claim 1, wherein the pages comprise markup language objects.

3. The method of claim 1, wherein the view presents the set of related pages according to user-defined font and zoom criteria.

4. The method of claim 1, further comprising, responsive to user manipulation of at least one presentation criterion for the set of related pages, reformatting the set of related pages for presentation according to a new one or more user-defined presentation criteria and presenting the set of related pages on the display of the computer system according to said reformatting, wherein the new one or more user-defined presentation criteria comprises one or more of a zoom criterion and a font size criterion.

5. The method of claim 1, wherein the set of related pages presented within the single view comprises two or more groupings of pages, each grouping consisting of a common set of pages and each grouping presenting the set of pages in a respective different target format for presentation on a respective different target presentation device.

6. A computer-based system comprising a server configured to present via a communicatively coupled client and responsive to user-designation, a set of related pages of an electronic content work for view via a user interface displayed within a single view on a display of the client, the user interface presenting the pages of the electronic content work sized according to a target format for the electronic content work on a display of a first target presentation device, wherein each of the related pages comprises a markup language object;

the server further configured to receive a target format user input via the client, the user input indicative of a request for presentation of the set of related pages according a different target format for presentation on a second target presentation device; and to present, via the user interface, a reformatted set of related pages on the display of the computer system, the reformatted set of related pages formatted for presentation according to the different target format for presentation on the second target presentation device;

the server further configured to receive an isolation user input through selection of an isolation control tool, and detect a selection of a content element in a respective page in the single view, wherein the content element is a heading;

present, within the single view, highlighting of content elements that are similar to the selected content element within the set of related pages;

receive editing user input, wherein the editing user input includes additions or subtractions from the content or changes to the format of the content; and present, within the single view, the set of related pages with the editing user input incorporated.

7. The system of claim 6, wherein the user interface presents the set of related pages according to user-defined font and zoom criteria.

8. The system of claim 7, wherein the server is further configured to respond to user manipulation of at least one presentation criterion for the set of related pages by reformatting the set of related pages for presentation according to a new one or more user-defined presentation criteria and to present, via the user interface, the set of related pages on the display of the client according to said reformatting, wherein the new one or more user-defined presentation criteria comprises one or more of a zoom criterion and a font size criterion.

* * * * *